United States Patent
Asahara et al.

(10) Patent No.: US 10,355,124 B1
(45) Date of Patent: Jul. 16, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Hidetoshi Asahara, Ibo Hyogo (JP); Akihiro Tanaka, Himeji Hyogo (JP)

(73) Assignees: Kabushiki Kaisha Toshiba, Tokyo (JP); Toshiba Electronics Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/032,126

(22) Filed: Jul. 11, 2018

(30) Foreign Application Priority Data

Mar. 23, 2018 (JP) .................................. 2018-055792

(51) Int. Cl.
*H01L 27/082* (2006.01)
*H01L 29/739* (2006.01)
(Continued)

(52) U.S. Cl.
CPC ...... *H01L 29/7803* (2013.01); *H01L 29/0615* (2013.01); *H01L 29/0856* (2013.01); *H01L 29/0873* (2013.01); *H01L 29/1037* (2013.01); *H01L 29/1095* (2013.01); *H01L 29/7813* (2013.01); *H01L 27/088* (2013.01); *H01L 27/0823* (2013.01); *H01L 29/66348* (2013.01); *H01L 29/7395* (2013.01); *H03K 17/6871* (2013.01)

(58) Field of Classification Search
CPC ........... H01L 29/66348; H01L 29/7395; H01L 27/0823; H01L 27/088
See application file for complete search history.

(56) References Cited

U.S. PATENT DOCUMENTS

| 6,690,061 B2 | 2/2004 | Yoneda et al. |
| 7,772,704 B2 | 8/2010 | Yoshida et al. |
| 2002/0003250 A1* | 1/2002 | Werner ............... H01L 29/0834 257/302 |

(Continued)

FOREIGN PATENT DOCUMENTS

| JP | 2003-101025 A | 4/2003 |
| JP | 2008-053623 A | 3/2008 |
| JP | 2010-087096 A | 4/2010 |

*Primary Examiner* — George R Fourson, III
(74) *Attorney, Agent, or Firm* — White & Case LLP

(57) ABSTRACT

A semiconductor device of an embodiment includes a semiconductor layer having a first plane and a second plane; a first conductivity type first semiconductor region; a first conductivity type second semiconductor region between the first semiconductor region and the first plane; a second conductivity type third semiconductor region and a fourth semiconductor region between the second semiconductor region and the first plane; a first conductivity type fifth semiconductor region between the third semiconductor region and the first plane; a first conductivity type sixth semiconductor region type between the fourth semiconductor region and the first plane; a first conductivity type seventh semiconductor region between the third semiconductor region and the fourth semiconductor region, between the first semiconductor region and the first plane, and having impurity concentration higher than the first conductivity type impurity concentration of the second semiconductor region; first and a second gate electrode; first and second gate insulating film.

10 Claims, 8 Drawing Sheets

(51) Int. Cl.
*H01L 29/732* (2006.01)
*H01L 29/78* (2006.01)
*H01L 29/08* (2006.01)
*H01L 29/10* (2006.01)
*H01L 29/06* (2006.01)
*H03K 17/687* (2006.01)
*H01L 27/088* (2006.01)
*H01L 29/66* (2006.01)

(56) References Cited

U.S. PATENT DOCUMENTS

| | | | |
|---|---|---|---|
| 2008/0179670 A1* | 7/2008 | Willmeroth | H01L 29/402 257/340 |
| 2009/0173993 A1* | 7/2009 | Andrews | H01L 29/0657 257/330 |
| 2009/0184352 A1* | 7/2009 | Yamaguchi | H01L 21/823487 257/296 |
| 2013/0001677 A1* | 1/2013 | Okaji | H01L 21/823487 257/330 |
| 2013/0069710 A1* | 3/2013 | Hirler | H01L 29/707 327/534 |
| 2013/0264637 A1* | 10/2013 | Katou | H01L 29/7827 257/331 |
| 2014/0145206 A1* | 5/2014 | Siennieniec | H01L 29/7808 257/77 |
| 2015/0129958 A1* | 5/2015 | Nita | H01L 27/088 257/334 |
| 2015/0155380 A1* | 6/2015 | Schulze | H01L 29/0649 257/330 |
| 2015/0357424 A1* | 12/2015 | Kitao | H01L 29/41741 257/334 |
| 2016/0027736 A1* | 1/2016 | Ohtani | H01L 29/42372 257/334 |

* cited by examiner

FIRST DIRECTION

SEMICONDUCTOR DEVICE

This application is based upon and claims the benefit of priority from Japanese Patent Application No. 2018-055792, filed on Mar. 23, 2018, the entire contents of which are incorporated herein by reference.

FIELD

Embodiments described herein relate generally to a semiconductor device.

BACKGROUND

For example, a bidirectional switching device, which controls a charging current and a discharging current whose directions are diametrically opposite to each other is required in order to control a charge/discharge state of a secondary battery. For example, it is possible to use two metal insulator field effect transistors (MISFET) in which drain electrodes are connected to each other in the bidirectional switching device. There is a bidirectional switching device in which two MISFETs are integrated into one chip in order for downsizing. Reduction in on-resistance is required in order to improve performance of the bidirectional switching device downsized through the integration into one chip.

DETAILED DESCRIPTION

Figure 1:
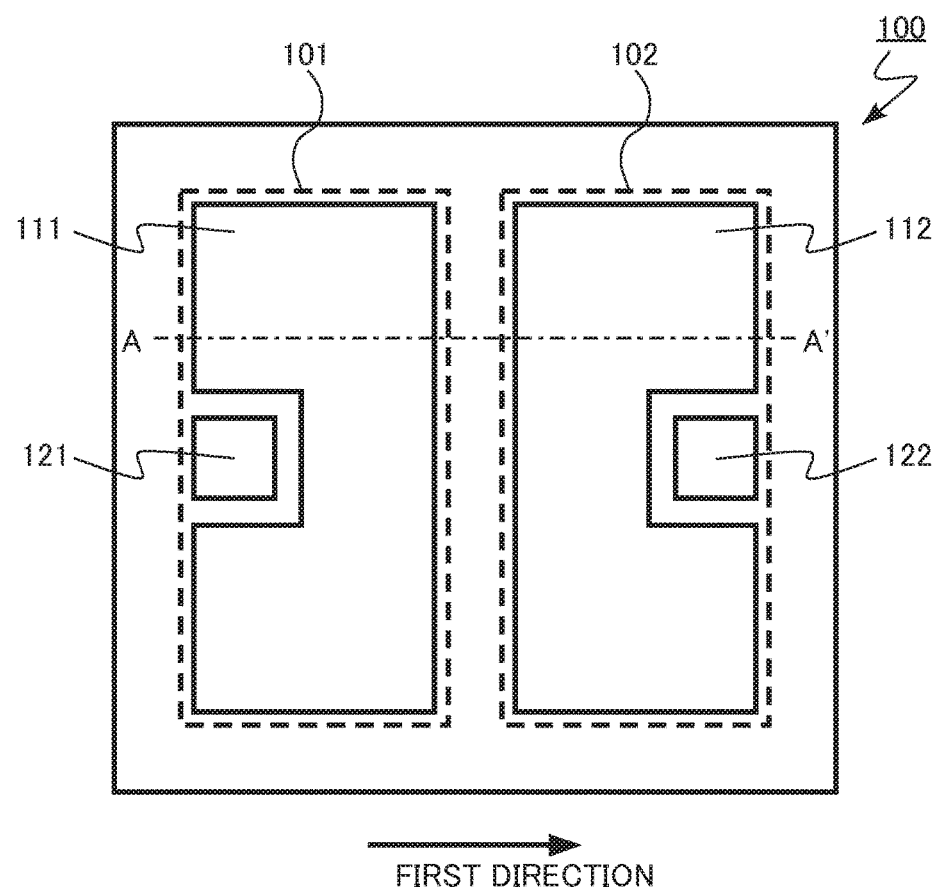
FIG. 1 is a layout diagram of a semiconductor device according to a first embodiment.

In this specification, the same or similar members will be denoted by the same reference numerals, and redundant descriptions thereof will be omitted in some cases.

In the following description, the notations $n^{++}$, $n^+$, n, $n^-$, $p^{++}$, $p^+$, p, and $p^-$ will be used in some cases. These notations represent a relative level of an impurity concentration in each conductivity type. That is, $n^{++}$ indicates an n-type impurity concentration relatively higher than that of $n^+$, $n^+$ indicates an n-type impurity concentration relatively higher than that of n, and $n^-$ indicates an n-type impurity concentration relatively lower than that of n. In addition, $p^{++}$ indicates a p-type impurity concentration relatively higher than that of $p^+$, $p^+$ indicates a p-type impurity concentration relatively higher than that of p, and $p^-$ indicates a p-type impurity concentration relatively lower than that of p. In some cases, an $n^{++}$-type, an $n^+$-type, and an $n^-$-type will be simply referred to as an n-type, and a $p^{++}$-type, a $p^+$-type, and a $p^-$-type will be simply referred to as a p-type.

The impurity concentration can be measured by secondary ion mass spectrometry (SIMS), for example. In addition, a relative level of the impurity concentration can also be determined based on a level of a carrier concentration obtained by, for example, scanning capacitance microscopy (SCM). In addition, a distance such as a depth and a thickness of an impurity region can be obtained by SIMS, for example. In addition, a distance such as a depth, a thickness, a width, and an interval of an impurity region can be obtained from an SCM image or a combined image of the SCM image and an atomic force microscope (AFM) image, for example.

First Embodiment

A semiconductor device according to a first embodiment includes a semiconductor layer having a first plane and a second plane; a first semiconductor region of a first conductivity type provided in the semiconductor layer; a second semiconductor region of the first conductivity type provided in the semiconductor layer, positioned between the first semiconductor region and the first plane, and having a first conductivity type impurity concentration lower than a first conductivity type impurity concentration of the first semiconductor region; a third semiconductor region of a second conductivity type provided in the semiconductor layer and positioned between the second semiconductor region and the first plane; a fourth semiconductor region of the second conductivity type provided in the semiconductor layer, positioned between the second semiconductor region and the first plane, and separated from the third semiconductor region; a fifth semiconductor region of the first conductivity type provided in the semiconductor layer and positioned between the third semiconductor region and the first plane; a sixth semiconductor region of the first conductivity type provided in the semiconductor layer and positioned between the fourth semiconductor region and the first plane; a seventh semiconductor region of the first conductivity type provided in the semiconductor layer, positioned between the first plane between the third semiconductor region and the fourth semiconductor region and the first semiconductor region, having a first conductivity type impurity concentration higher than the first conductivity type impurity concentration of the second semiconductor region, and being in contact with the first semiconductor region; a first gate electrode; a second gate electrode; a first gate insulating film provided between the second semiconductor region and the first gate electrode, between the third semiconductor region and the first gate electrode, and between the fifth semiconductor region and the first gate electrode; and a second gate insulating film provided between the second semiconductor region and the second gate electrode, between the fourth semiconductor region and the second gate electrode, and between the sixth semiconductor region and the second gate electrode.

FIG. 1 is a layout diagram of the semiconductor device according to the first embodiment.

The semiconductor device of the first embodiment is a bidirectional switching device 100. The bidirectional switching device 100 has a structure in which two trench gate type MISFETs are connected so as to have a common drain electrode. The bidirectional switching device 100 is a bidirectional switching device in which the two trench gate type MISFETs are integrated into one chip.

Hereinafter, a case where the first conductivity type is the n type and the second conductivity type is the p type will be described as an example. The MISFET of the first embodiment is an n-channel MISFET using electrons as carriers.

The bidirectional switching device 100 includes a first transistor region 101 and a second transistor region 102.

The first transistor region 101 includes a plurality of MISFETs. In addition, the second transistor region 102 includes a plurality of MISFETs.

The first transistor region 101 includes a first source electrode 111 and a first gate electrode pad 121. The second transistor region 102 includes a second source electrode 112 and a second gate electrode pad 122.

Figure 2:
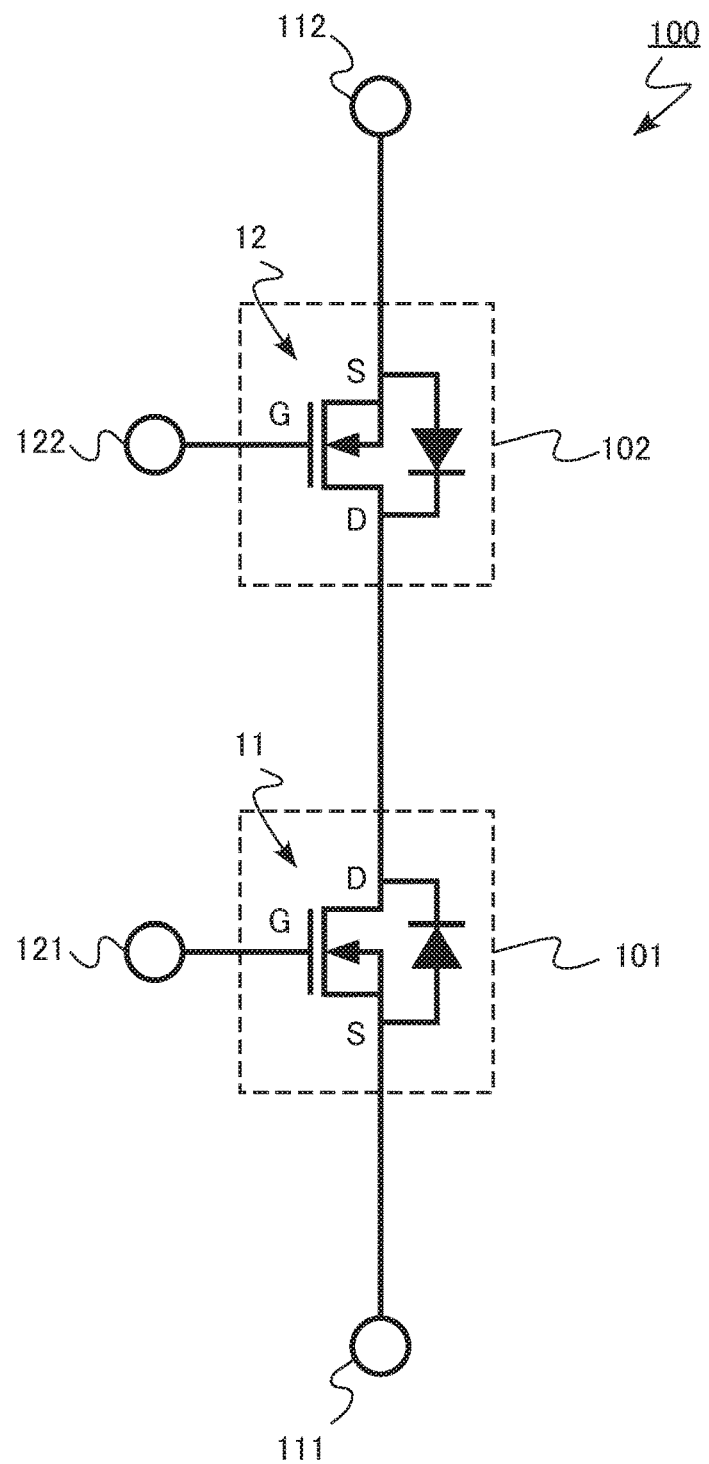
FIG. 2 is an equivalent circuit diagram of the semiconductor device according to the first embodiment.

FIG. 2 is an equivalent circuit diagram of the semiconductor device according to the first embodiment.

As illustrated in FIG. 2, a drain of a MISFET 11 of the first transistor region 101 and a drain of a MISFET 12 of the second transistor region 102 are connected. A source of the MISFET 11 is connected to the first source electrode 111. A source of the MISFET 12 is connected to the second source electrode 112. A gate electrode of the MISFET 11 is connected to the first gate electrode pad 121. A gate electrode of the MISFET 12 is connected to the second gate electrode pad 122.

Each of the MISFET 11 and the MISFET 12 has a built-in body diode.

Figure 3:
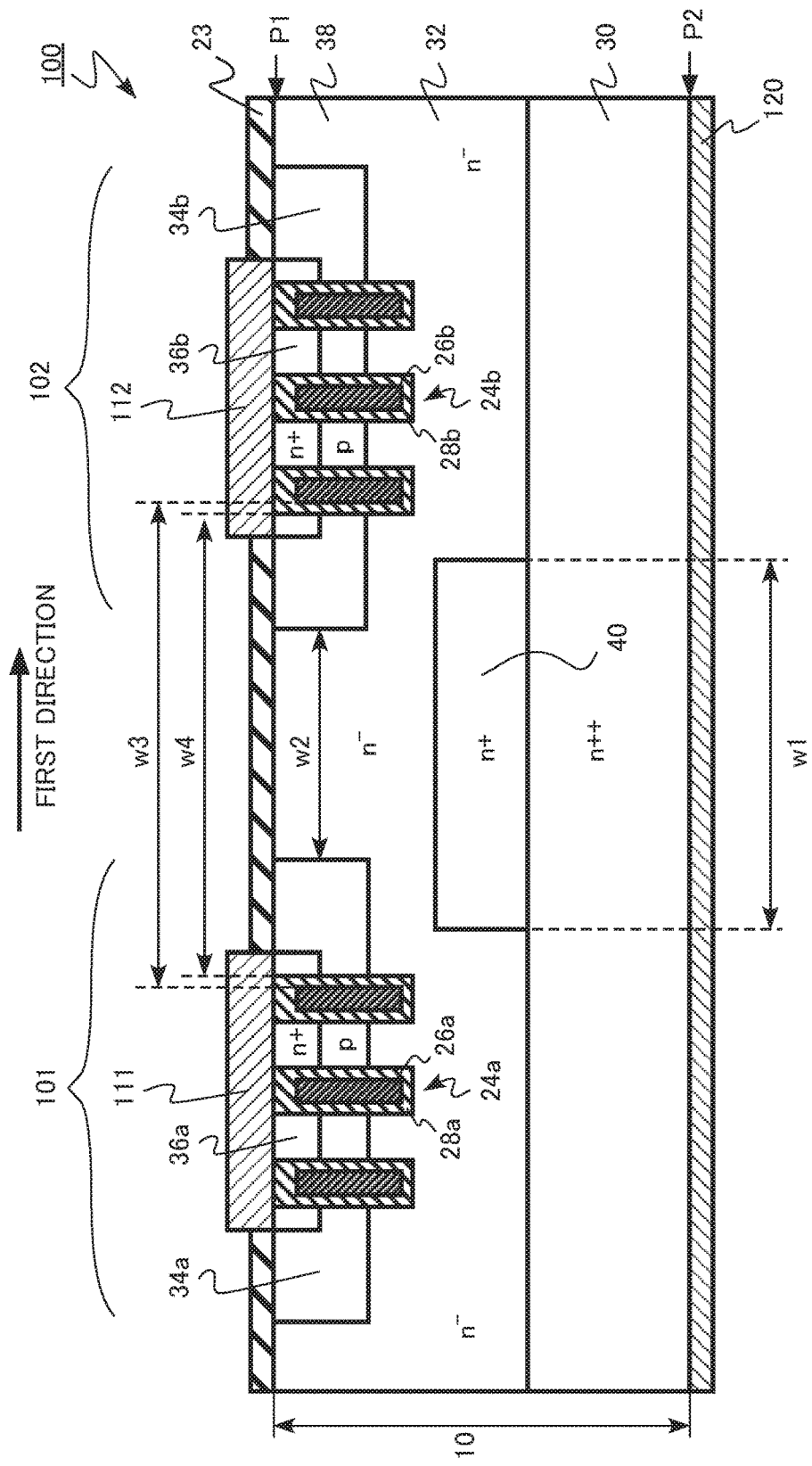
FIG. 3 is a schematic cross-sectional view of the semiconductor device according to the first embodiment.

FIG. 3 is a schematic cross-sectional view of the semiconductor device according to the first embodiment. FIG. 3 is a cross section taken along a line AA' of FIG. 1. Hereinafter, a direction along the line AA' will be defined as a first direction.

The bidirectional switching device 100 includes a semiconductor layer 10, the first source electrode 111, the second source electrode 112, a drain electrode 120, and an insulating layer 23. A drain region 30 (first semiconductor region), a drift region 32 (second semiconductor region), a first base region 34a (third semiconductor region), a second base region 34b (fourth semiconductor region), a first source region 36a (fifth semiconductor region), a second source region 36b (sixth semiconductor region), and a low-resistance region (seventh semiconductor region) 40 are provided in the semiconductor layer 10.

In addition, a first trench 24a, a second trench 24b, a first gate electrode 26a, a second gate electrode 26b, a first gate insulating film 28a, and a second gate insulating film 28b are provided in the semiconductor layer 10.

The semiconductor layer 10 has a first plane (P1 in FIG. 3) and a second plane (P2 in FIG. 3). The first plane P1 is a front surface of the semiconductor layer 10 and the second plane P2 is a back surface of the semiconductor layer 10.

The semiconductor layer 10 is, for example, a single crystal layer of silicon (Si). The first plane is, for example, a (001) face of silicon.

The first transistor region 101 includes the first base region 34a, the first source region 36a, the first trench 24a, the first gate electrode 26a, the first gate insulating film 28a, the drift region 32, and the drain region 30. The first gate electrode 26a is the gate electrode of the MISFET 11.

The second transistor region 102 includes the second base region 34b, the second source region 36b, the second trench 24b, the second gate electrode 26b, the second gate insulating film 28b, the drift region 32, and the drain region 30. The second gate electrode 26b is the gate electrode of the MISFET 12.

The $n^{++}$-type drain region 30 is an impurity region containing n-type impurities. The drain region 30 is provided in contact with the second plane P2.

The drain region 30 contains, for example, phosphorus (P), arsenic (As), or antimony (Sb) as n-type impurities. An n-type impurity concentration of the drain region 30 is, for example, $1\times10^5$ cm$^{-3}$ to $1\times10^{22}$ cm$^{-3}$.

The $n^{++}$-type drift region 32 is an impurity region containing n-type impurities. The drift region 32 is positioned between the drain region 30 and the first plane P1.

The drift region 32 contains, for example, phosphorus (P) as n-type impurities. An n-type impurity concentration of the drift region 32 is lower than an n-type impurity concentration of the drain region 30. The n-type impurity concentration of the drift region 32 is, for example, $1\times10^{15}$ cm$^{-3}$ to $5\times10^{16}$ cm$^{-3}$.

The drift region 32 is formed, for example, on the drain region 30 using an epitaxial growth method. A thickness of the drift region 32 is, for example, 2 µm to 5 µm.

The p-type first base region 34a is an impurity region containing p-type impurities. The first base region 34a is positioned between the drift region 32 and the first plane P1.

The first base region 34a contains, for example, boron (B) as p-type impurities. A p-type impurity concentration of the first base region 34a is, for example, $5\times10$ cm$^{-3}$ to $1\times10^{18}$ cm$^{-3}$.

The p-type second base region 34b is an impurity region containing p-type impurities. The second base region 34b is positioned between the drift region 32 and the first plane P1. The second base region 34b is separated from the first base region 34a.

The second base region 34b contains, for example, boron (B) as p-type impurities. A p-type impurity concentration of the second base region 34b is, for example, $5\times10^{16}$ cm$^{-3}$ to $1\times10^{18}$ cm$^{-3}$.

The $n^+$-type first source region 36a is an impurity region containing n-type impurities. The first source region 36a is provided between the first base region 34a and the first plane P1. The first source region 36a is in contact with the first plane P1.

The first source region 36a contains, for example, phosphorus (P) or arsenic (As) as n-type impurities. An n-type impurity concentration of the first source region 36a is higher than the n-type impurity concentration of the drift region 32. The n-type impurity concentration of the first source region 36a is, for example, $1\times10^{19}$ cm$^{-3}$ to $1\times10^{21}$ cm$^{-3}$.

The $n^+$-type second source region 36b is an impurity region containing n-type impurities. The second source region 36b is provided between the second base region 34b and the first plane P1. The second source region 36b is in contact with the first plane P1.

The second source region 36b contains, for example, phosphorus (P) or arsenic (As) as n-type impurities. An n-type impurity concentration of the second source region 36b is higher than the n-type impurity concentration of the drift region 32. The n-type impurity concentration of the second source region 36b is, for example, $1\times10^{19}$ cm$^{-3}$ to $1\times10^{21}$ cm$^{-3}$.

The first base region 34a, the second base region 34b, the first source region 36a, and the second source region 36b are formed by, for example, an ion implantation method.

The $n^+$-type low-resistance region 40 is an impurity region containing n-type impurities. The low-resistance region 40 is provided between the first plane P1 between the first base region 34a and the second base region 34b, and the drain region 30. The low-resistance region 40 is positioned between the drain region 30 and the first plane P1. For example, a positional relationship among the low-resistance region 40, the first base region 34a, and the second base region 34b is bilaterally symmetrical.

The low-resistance region 40 contains, for example, phosphorus (P), arsenic (As), or antimony (Sb) as n-type impurities. An n-type impurity concentration of the low-resistance region 40 is higher than the n-type impurity concentration of the drift region 32. The n-type impurity concentration of the low-resistance region 40 is, for example, $1 \times 10^{17}$ cm$^{-3}$ to $1 \times 10^{19}$ cm$^{-3}$.

The low-resistance region 40 is in contact with the drain region 30. The drift region 32 does not exist between the low-resistance region 40 and the drain region 30.

The low-resistance region 40 is formed by, for example, a high-acceleration ion implantation method. In addition, the low-resistance region 40 is formed by, for example, an embedded epitaxial growth method.

The first trench 24a extends in a direction from the first plane P1 to the second plane P2. The first trench 24a passes through the first base region 34a and reaches the drift region 32.

The first gate electrode 26a is provided in the first trench 24a. The first gate electrode 26a is electrically connected to the first gate electrode pad 121. The first gate electrode 26a is, for example, polycrystalline silicon containing conductive impurities. The first gate insulating film 28a is provided in the first trench 24a. The first gate insulating film 28a is provided between the first gate electrode 26a and the first base region 34a. The first gate electrode 26a is, for example, a silicon oxide film.

The second trench 24b extends in the direction from the first plane P1 to the second plane P2. The second trench 24b passes through the second base region 34b and reaches the drift region 32.

The second gate electrode 26b is provided in the second trench 24b. The second gate electrode 26b is electrically connected to the second gate electrode pad 122. The second gate electrode 26b is, for example, polycrystalline silicon containing conductive impurities.

The second gate insulating film 28b is provided in the second trench 24b. The second gate insulating film 28b is provided between the second gate electrode 26b and the second base region 34b. The second gate electrode 26b is, for example, a silicon oxide film.

The first source electrode 111 is provided on the first plane P1 side of the semiconductor layer 10. The first source electrode 111 is in contact with the first source region 36a. The first source electrode 111 is, for example, metal.

The second source electrode 112 is provided on the first plane P1 side of the semiconductor layer 10. The second source electrode 112 is in contact with the second source region 36b. The second source electrode 112 is, for example, metal.

The drain electrode 120 is provided on the second plane P2 side of the semiconductor layer 10. The drain electrode 120 is in contact with the second plane P2. The drain electrode 120 is in contact with the drain region 30. The drain electrode 120 is, for example, metal.

The insulating layer 23 is provided on the first plane P1. The insulating layer 23 is, for example, silicon oxide.

For example, a width (w1 in FIG. 3) of the low-resistance region 40 in a cross section perpendicular to the first plane P1 is wider than an interval (w2 in FIG. 3) between the first base region 34a and the second base region 34b in the cross section. That is, a width of the low-resistance region 40 in the first direction is wider than the interval between the first base region 34a and the second base region 34b in the first direction. The first direction is parallel to the first plane P1.

In addition, the width (w1 in FIG. 3) of the low-resistance region 40 in the cross section perpendicular to the first plane P1 is narrower than an interval (w3 in FIG. 3) between the first gate electrode 26a and the second gate electrode 26b in the cross section, for example. That is, the width of the low-resistance region 40 is narrower than the interval between the first gate electrode 26a and the second gate electrode 26b in the first direction, for example. Incidentally, the interval between the first gate electrode 26a and the second gate electrode 26b is the closest interval between the first gate electrode 26a and the second gate electrode 26b.

In addition, the width (w1 in FIG. 3) of the low-resistance region 40 in the cross section perpendicular to the first plane P1 is narrower than an interval (w4 in FIG. 3) between the first trench 24a and the second trench 24b in the cross section, for example. That is, the width of the low-resistance region 40 is narrower than the interval between the first trench 24a and the second trench 24b in the first direction. Incidentally, the interval between the first trench 24a and the second trench 24b is the closest interval between the first trench 24a and the second trench 24b.

For example, the drift region 32 exists between the low-resistance region 40 and the first plane P1. In addition, the drift region 32 exists between the low-resistance region 40 and the first base region 34a. In addition, the drift region 32 exists between the low-resistance region 40 and the second base region 34b.

Next, a function and an effect of the semiconductor device of the first embodiment will be described.

In the bidirectional switching device in which the MISFETs are integrated into one chip, reduction in on-resistance is required in order to improve performance of the device.

Figure 4:
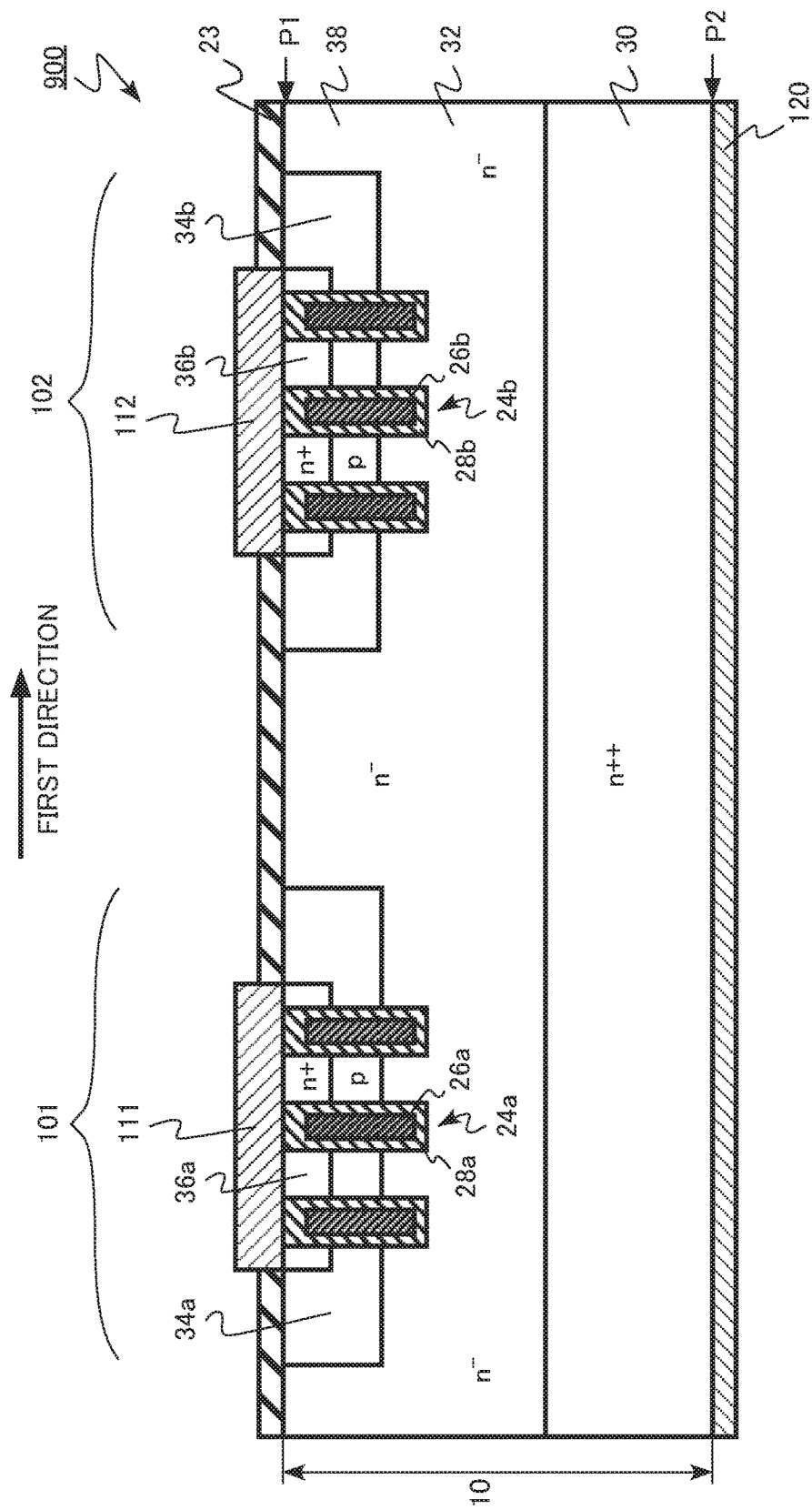
FIG. 4 is a schematic cross-sectional view of a semiconductor device according to a comparative example.

FIG. 4 is a schematic cross-sectional view of a semiconductor device according to a comparative example. FIG. 4 is a cross-sectional view corresponding to FIG. 3 which is the schematic cross-sectional view of the semiconductor device of the first embodiment.

The semiconductor device of the comparative embodiment is a bidirectional switching device 900. The bidirectional switching device 900 is a bidirectional switching device in which the two trench gate type MISFETs are integrated into one chip.

The bidirectional switching device 900 is different from that of the first embodiment in terms of not including the low-resistance region 40.

Figure 5:
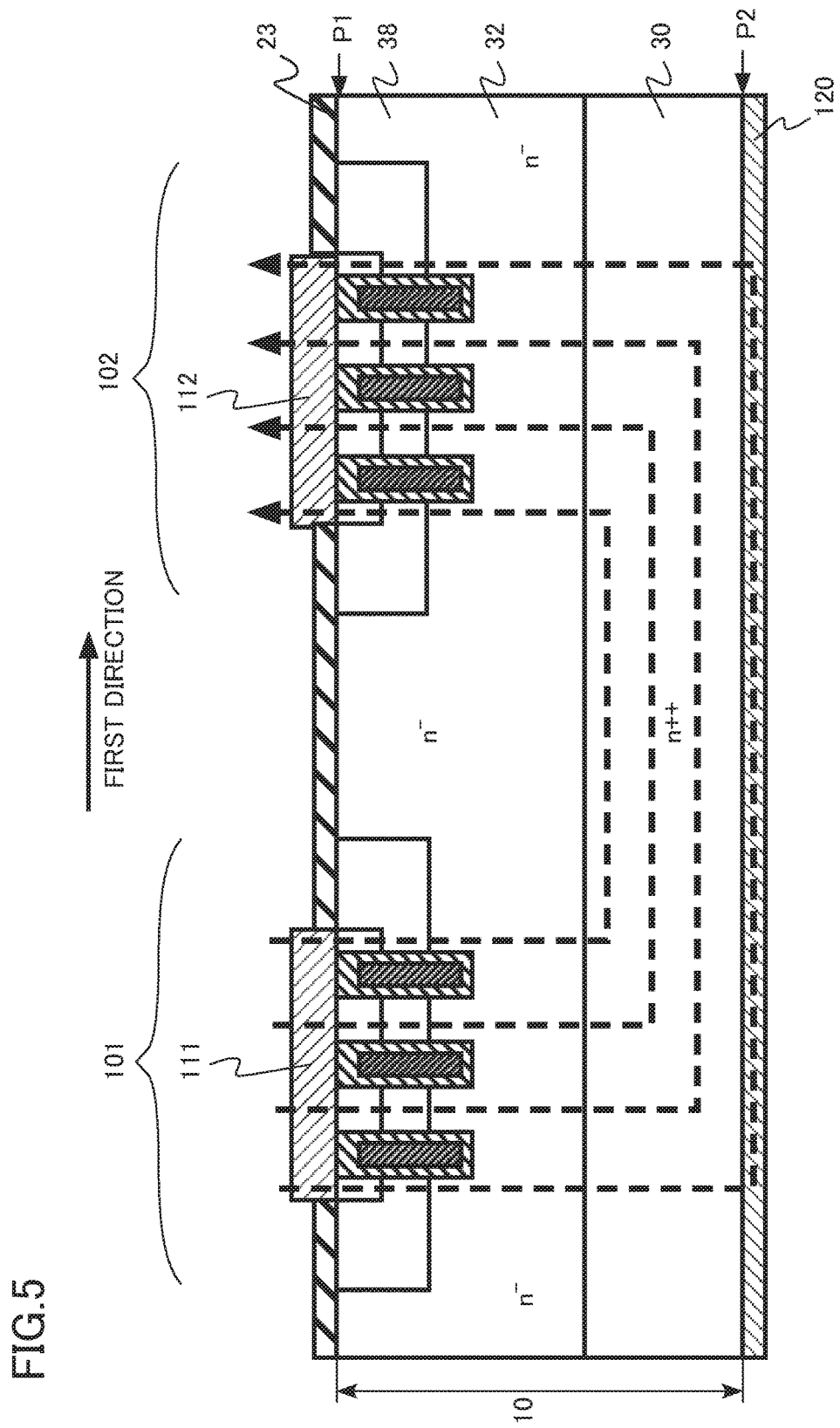
FIG. 5 is an explanatory diagram of a current path of the semiconductor device according to the comparative example.

FIG. 5 is an explanatory diagram of a current path of the semiconductor device according to the comparative example.

For example, it is assumed that an on-current flows from a first source electrode 111 of a first transistor region 101 toward a second source electrode 112 of a second transistor region 102. Each electrical resistance of a drain region 30 and a drain electrode 120 is lower than that of a drift region 32. Thus, the on-current flows along a current path from the first source electrode 111 to the second source electrode 112 passing through the drift region 32, the drain region 30, and the drift region 32 as indicated by a dashed arrow in FIG. 5. Alternatively, the on-current flows along a current path from the first source electrode 111 to the second source electrode 112 passing through the drift region 32, the drain region 30, the drain electrode 120, the drain region 30, and the drift region 32, as indicated by a broken arrow in FIG. 5. Incidentally, it is described that only the current flowing between an outer end portion of the first transistor region 101 and an outer end portion of the second transistor region 102 flows along the current path passing through the drain electrode 120 for the sake of description in FIG. 5. In practice, however, a current between a portion other than the outer end portion of the first transistor region 101 and a portion other than the outer end portion of the second transistor region 102 also flows along the current path passing through the drain electrode 120

It is conceivable to lower an electrical resistance of the current path by thinning a thickness of the drift region 32 having a high electrical resistance in order to reduce an on-resistance of the bidirectional switching device 900. That is, it is conceivable to shorten a distance between the drain region 30 and a first base region 34a and a distance between the drain region 30 and a second base region 34b.

When the thickness of the drift region 32 is thinned, however, a breakdown voltage between the first source electrode 111 and the second source electrode 112 decreases. In other words, a breakdown voltage of the bidirectional switching device 900 decreases. Accordingly, there is a limit in such a method of reducing the on-resistance by thinning the thickness of the drift region 32.

Figure 6:
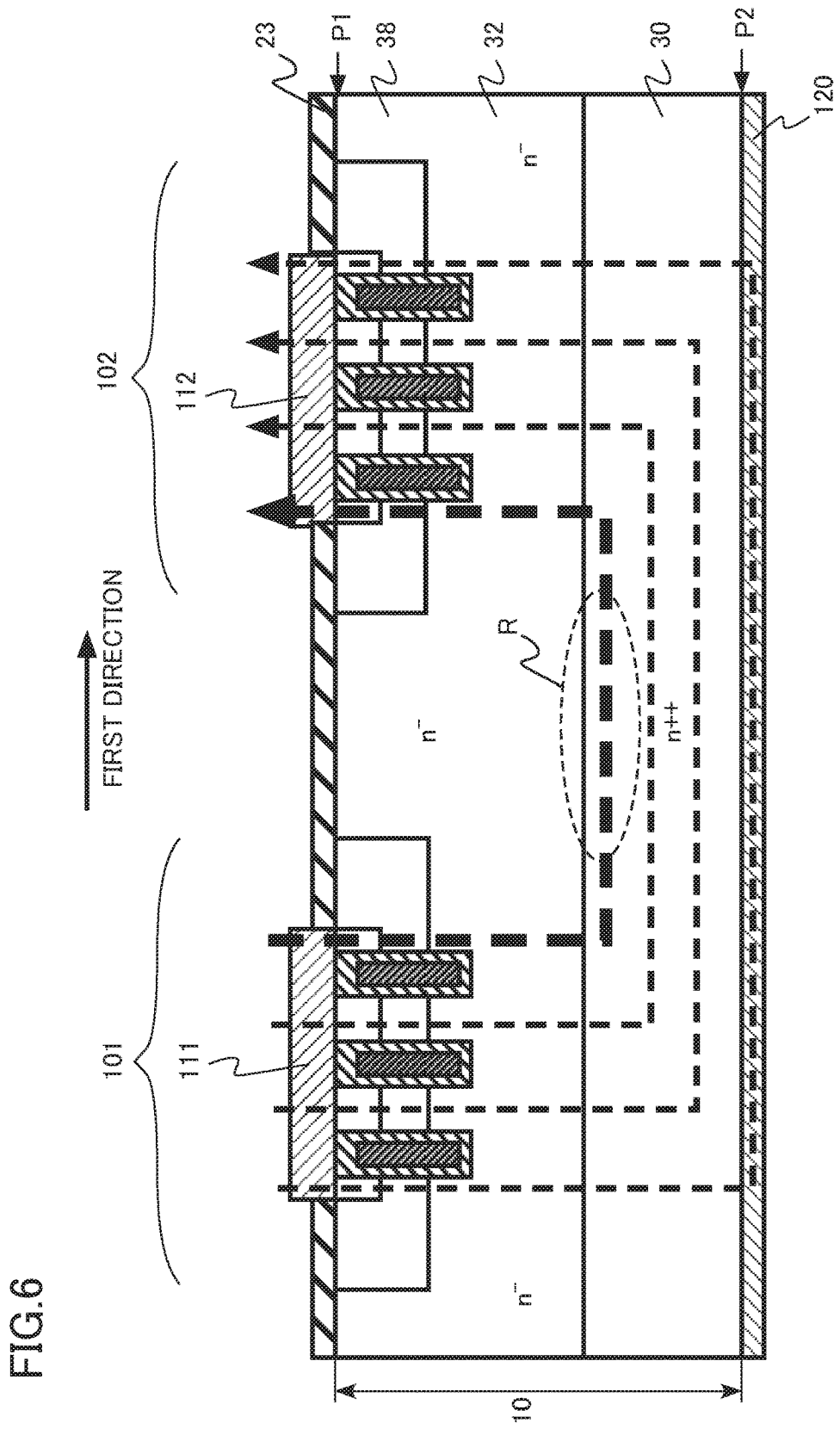
FIG. 6 is an explanatory diagram of the current path of the semiconductor device according to the comparative example.

FIG. 6 is an explanatory diagram of the current path of the semiconductor device according to the comparative example.

As a result of simulation on the current path by the inventors, it has been found that a current concentrates on in a region (R in FIG. 6) in an upper part of the drain region 30 below a boundary portion between the first transistor region 101 and the second transistor region 102. Thus, it has become clear that a large current flows along a current path (a bold dashed arrow in FIG. 6) at the boundary portion between the first transistor region 101 and the second transistor region 102.

Figure 7:
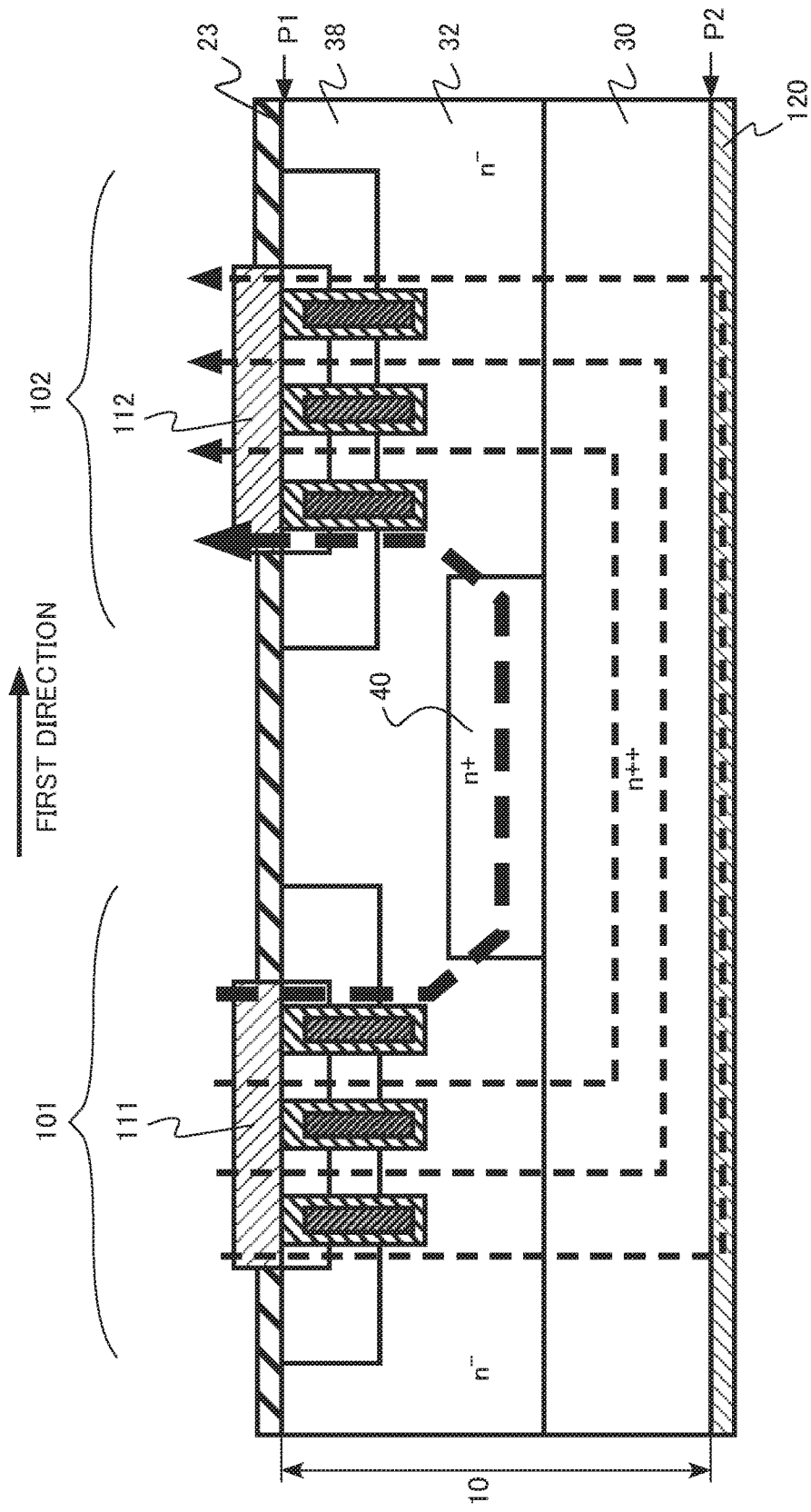
FIG. 7 is an explanatory diagram of a current path of the semiconductor device according to the first embodiment.

FIG. 7 is an explanatory diagram of a current path of the semiconductor device of the first embodiment.

The bidirectional switching device 100 of the first embodiment includes the low-resistance region 40 on the drain region 30 below a boundary portion between the first transistor region 101 and the second transistor region 102. As the low-resistance region 40 is provided, an electrical resistance below the boundary portion between the first transistor region 101 and the second transistor region 102 is reduced. Thus, a larger current can flow along a current path (a bold broken line arrow in FIG. 7) at the boundary portion between the first transistor region 101 and the second transistor region 102. In other words, an on-resistance of the bidirectional switching device 100 is reduced.

Incidentally, the influence on a breakdown voltage between the first source electrode 111 and the second source electrode 112 by providing the low-resistance region 40 is extremely small. This is because the breakdown voltage is secured by extending a depletion layer in the drift region 32 not in the vertical direction but in the horizontal direction at the boundary portion between the first transistor region 101 and the second transistor region 102. As the depletion layer extends from an end portion of the first base region 34a and an end portion of the second base region 34b in a direction parallel to the first plane P1, the breakdown voltage of the bidirectional switching device 100 is secured.

As illustrated in FIG. 3, the width w1 of the low-resistance region 40 in the cross section perpendicular to the first plane P1 is preferably wider than the width w2 between the first base region 34a and the second base region 34b in the cross section, for example. That is, it is preferable that the width w1 of the low-resistance region 40 in the first direction be wider than the interval w2 between the first base region 34a and the second base region 34b in the first direction.

The on-resistance is further reduced by increasing the width w1 of the low-resistance region 40. Incidentally, even if the low-resistance region 40 is provided below the end portion of the first base region 34a and below the second base region 34b as described above, the influence on the breakdown voltage of the bidirectional switching device 100 is extremely small.

In addition, the width w1 of the low-resistance region 40 in the cross section perpendicular to the first plane P1 is preferably narrower than the interval w3 between the first gate electrode 26a and the second gate electrode 26b in the cross section. That is, it is preferable that the width of the low-resistance region 40 be narrower than the interval w3 between the first gate electrode 26a and the second gate electrode 26b in the first direction.

In addition, the width w1 of the low-resistance region 40 in the cross section perpendicular to the first plane P1 is preferably narrower than the interval w4 between the first trench 24a and the second trench 24b in the cross section. That is, it is preferable that the width w1 of the low-resistance region 40 be narrower than the interval w4 between the first trench 24a and the second trench 24b in the first direction.

If the low-resistance region 40 extends up to a region below the MISFET of the first transistor region 101 or below the MISFET of the second transistor region 102, there is a risk that the breakdown voltage of the bidirectional switching device 100 may decrease.

The n-type impurity concentration of the low-resistance region 40 is preferably lower than the n-type impurity concentration of the drain region 30. It is difficult to make the n-type impurity concentration of the low-resistance region 40 equal to or higher than the n-type impurity concentration of the drain region 30 in terms of manufacturing.

As described above, it is possible to realize the bidirectional switching device 100 capable of reducing the on-resistance according to the first embodiment.

Second Embodiment

A semiconductor device according to a second embodiment is different from that of the first embodiment in terms that a distance between a seventh semiconductor region and a first plane at a first position in a cross section perpendicular to a first plane is smaller than a distance between the seventh semiconductor region and the first plane at a second position closer to a third semiconductor region than the first position, and is smaller than a distance between the seventh semiconductor region and the first plane at a third position closer to a fourth semiconductor region than the first position. Hereinafter, some of the content overlapping with that in the first embodiment will not be described.

The semiconductor device of the second embodiment is a bidirectional switching device 200.

Figure 8:
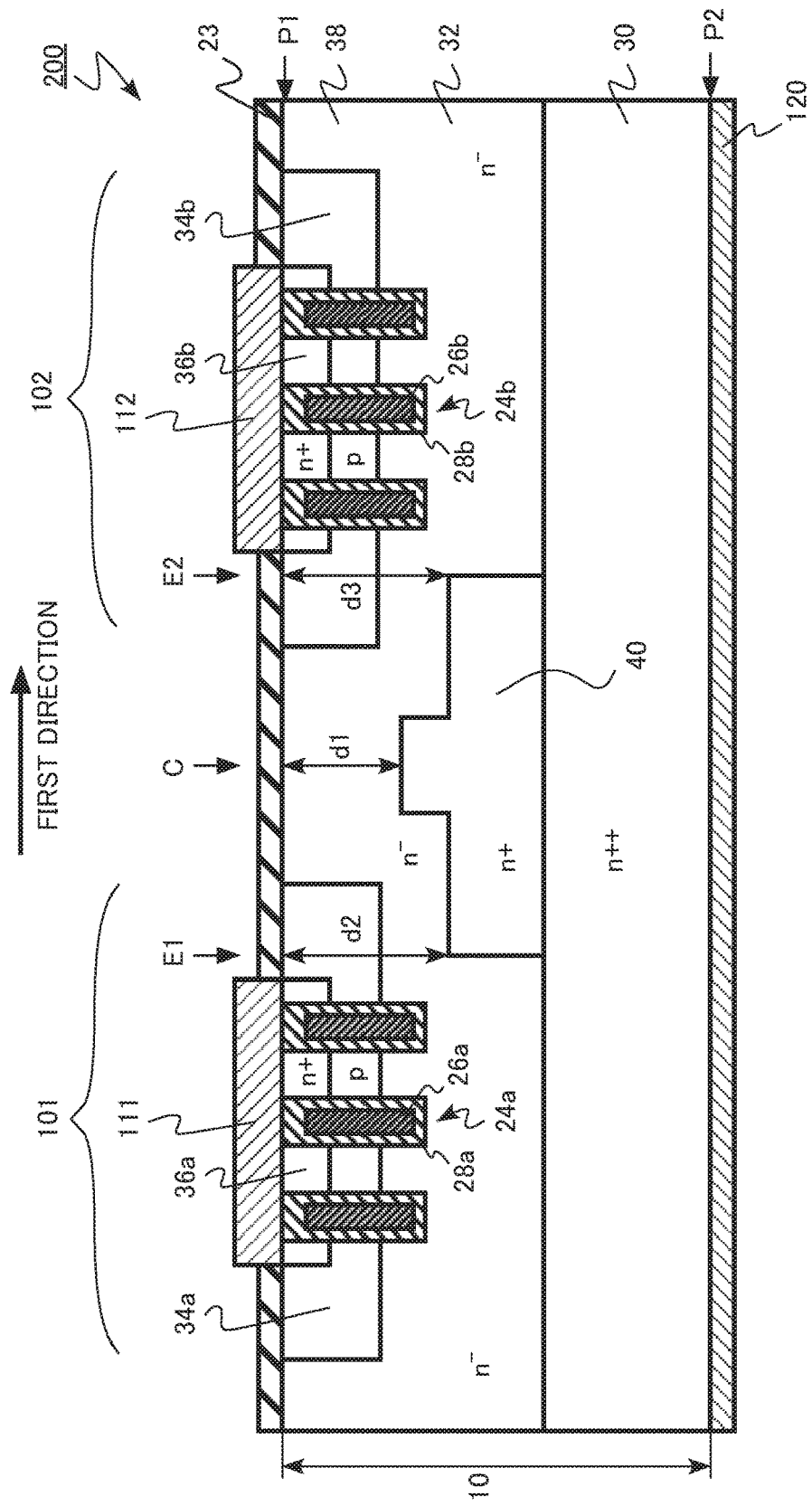
FIG. 8 is a schematic cross-sectional view of a semiconductor device according to a second embodiment.

FIG. 8 is a schematic cross-sectional view of the semiconductor device according to the second embodiment. FIG. 8 is a cross-sectional view corresponding to FIG. 3 which is the schematic cross-sectional view of the semiconductor device of the first embodiment.

A distance (d1 in FIG. 8) between a low-resistance region 40 and a first plane P1 at the first position (C in FIG. 8) is smaller than a distance (d2 in FIG. 8) between the low-resistance region 40 and the first plane P1 at a second position (E1 in FIG. 8) closer to a first base region 34a than the first position. The distance (d1 in FIG. 8) between the low-resistance region 40 and the first plane P1 at the first position (C in FIG. 8) is smaller than a distance (d3 in FIG. 8) between the low-resistance region 40 and the first plane P1 at a third position (E2 in FIG. 8) closer to a second base region 34b than the first position. That is, a thickness of the low-resistance region 40 in a direction from the first plane P1 to a second plane P2 is thick at a center portion of the low-resistance region 40 and is thin at end portions of the low-resistance region 40.

According to the bidirectional switching device 200 of the second embodiment, an electrical resistance below a boundary portion between a first transistor region 101 and a second transistor region 102 is further reduced. Thus, the on-resistance is further reduced.

Incidentally, it is also possible to configure the low-resistance region 40 to be in contact with the first plane P1. However, it is preferable to sufficiently secure a distance between a portion where the low-resistance region 40 is in contact with the first plane P1 and each of the first base region 34a and the second base region 34b in the horizontal direction (first direction) from the viewpoint of suppressing a decrease in a breakdown voltage of the bidirectional switching device 200. For example, it is preferable that a distance between the low-resistance region 40 and the first base region 34a in the horizontal direction (first direction) be equal to or longer than a distance between a drain region 30 and the first base region 34a. In addition, for example, it is preferable that a distance between the low-resistance region 40 and the second base region 34b in the horizontal direction (first direction) be equal to or longer than a distance between the drain region 30 and the second base region 34b.

As described above, it is possible to realize the bidirectional switching device 200 capable of further reducing the on-resistance according to the second embodiment.

Although the case of the n-channel MISFET using electrons as carriers has been described as an example in the first and second embodiments, a p-channel MISFET having holes as carriers can be applied instead of the n-channel MISFET. When the p-channel MISFET is applied, a first conductivity type is a p type and a second conductivity type is an n type.

In addition, the trench gate type MISFET has been described as an example in the first and second embodiments, but a planar gate type MISFET can also be used.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer having a first plane and a second plane;
a first semiconductor region of a first conductivity type provided in the semiconductor layer;
a second semiconductor region of the first conductivity type provided in the semiconductor layer, positioned between the first semiconductor region and the first plane, and having a first conductivity type impurity concentration lower than a first conductivity type impurity concentration of the first semiconductor region;
a third semiconductor region of a second conductivity type provided in the semiconductor layer and positioned between the second semiconductor region and the first plane;
a fourth semiconductor region of the second conductivity type provided in the semiconductor layer, positioned between the second semiconductor region and the first plane, and separated from the third semiconductor region;
a fifth semiconductor region of the first conductivity type provided in the semiconductor layer and positioned between the third semiconductor region and the first plane;
a sixth semiconductor region of the first conductivity type provided in the semiconductor layer and positioned between the fourth semiconductor region and the first plane;
a seventh semiconductor region of the first conductivity type provided in the semiconductor layer, positioned between the first plane between the third semiconductor region and the fourth semiconductor region and the first semiconductor region, having a first conductivity type impurity concentration higher than the first conductivity type impurity concentration of the second semiconductor region, and being in contact with the first semiconductor region;
a first gate electrode;
a second gate electrode;
a first gate insulating film provided between the second semiconductor region and the first gate electrode, between the third semiconductor region and the first gate electrode, and between the fifth semiconductor region and the first gate electrode; and
a second gate insulating film provided between the second semiconductor region and the second gate electrode, between the fourth semiconductor region and the second gate electrode, and between the sixth semiconductor region and the second gate electrode.

2. The semiconductor device according to claim 1, wherein
the second semiconductor region exists between the seventh semiconductor region and the first plane.

3. The semiconductor device according to claim 1, wherein
a width of the seventh semiconductor region in a direction connecting the third semiconductor region and the fourth semiconductor region in a cross section perpendicular to the first plane is wider than an interval between the third semiconductor region and the fourth semiconductor region in the cross section perpendicular to the first plane.

4. The semiconductor device according to claim 3, wherein
the width of the seventh semiconductor region is narrower than an interval between the first gate electrode and the second gate electrode in the cross section perpendicular to the first plane.

5. The semiconductor device according to claim 3, wherein
the second semiconductor region exists between the seventh semiconductor region and the third semiconductor region and between the seventh semiconductor region and the fourth semiconductor region.

6. The semiconductor device according to claim 1, wherein
a distance between the seventh semiconductor region and the first plane at a first position in a cross section perpendicular to the first plane is smaller than a distance between the seventh semiconductor region and the first plane at a second position closer to the third semiconductor region than the first position, and is smaller than a distance between the seventh semiconductor region and the first plane at a third position closer to the fourth semiconductor region than the first position.

7. The semiconductor device according to claim 1, further comprising:
   a first gate electrode pad electrically connected to the first gate electrode; and
   a second gate electrode pad electrically connected to the second gate electrode.

8. The semiconductor device according to claim 1, further comprising:
   a first source electrode provided in contact with the fifth semiconductor region on a first plane side of the semiconductor layer;
   a second source electrode provided in contact with the sixth semiconductor region on the first plane side of the semiconductor layer; and
   a drain electrode provided in contact with the second plane of the semiconductor layer.

9. The semiconductor device according to claim 1, wherein
   the first conductivity type is an n type and the second conductivity type is a p type.

10. The semiconductor device according to claim 1, wherein
    the semiconductor layer is silicon.

* * * * *